United States Patent
Bachman et al.

(10) Patent No.: US 9,443,821 B2
(45) Date of Patent: Sep. 13, 2016

(54) PB-FREE SOLDER BUMPS WITH IMPROVED MECHANICAL PROPERTIES

(71) Applicants: Mark Bachman, Wilmington, DE (US); John W. Osenbach, Wilmington, PA (US)

(72) Inventors: Mark Bachman, Wilmington, DE (US); John W. Osenbach, Wilmington, PA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 59 days.

(21) Appl. No.: 14/294,932

(22) Filed: Jun. 3, 2014

(65) Prior Publication Data

US 2014/0284376 A1    Sep. 25, 2014

Related U.S. Application Data

(62) Division of application No. 13/063,181, filed as application No. PCT/US2008/076543 on Sep. 16, 2008, now Pat. No. 8,779,587.

(51) Int. Cl.
*H01L 21/44* (2006.01)
*H01L 23/00* (2006.01)

(52) U.S. Cl.
CPC ............ *H01L 24/81* (2013.01); *H01L 24/11* (2013.01); *H01L 24/13* (2013.01); *H01L 2224/131* (2013.01); *H01L 2224/13099* (2013.01); *H01L 2224/81193* (2013.01); *H01L 2224/81801* (2013.01); *H01L 2924/0001* (2013.01); *H01L 2924/0103* (2013.01); *H01L 2924/014* (2013.01); *H01L 2924/0105* (2013.01);

(Continued)

(58) Field of Classification Search
CPC ............ H01L 2924/00014; H01L 2924/00; H01L 2924/00012; H01L 24/11; H01L 2224/32225
USPC ............... 438/613, 612; 257/737, E23.023, 257/E21.508
See application file for complete search history.

(56) References Cited

U.S. PATENT DOCUMENTS

| 6,517,602 B2 | 2/2003 | Sato et al. |
| 6,602,354 B2 | 8/2003 | Kanematsu et al. |

(Continued)

FOREIGN PATENT DOCUMENTS

| CN | 101072886 A | 11/2007 |
| JP | 2001298051 A | 10/2001 |

(Continued)

OTHER PUBLICATIONS

Johnson Mfg. Co., "Johnson's Pure Solders, Johnson Pure Solders are Vacuum Cast for Highest Purity," http://www.johnsonmfg.com/temp/NOLEAD.HTM, Jul. 23, 2008, 5 pages.

(Continued)

*Primary Examiner* — Andy Huynh (57) ABSTRACT

A method of forming an electronic device, comprising providing a semiconductor substrate having a first contact and an undoped electroplated lead-free solder bump formed on the first contact. The method also comprises providing a device package substrate having a second contact and a doped lead-free solder layer on the second contact comprising a fourth row transition metal dopant. The method further comprises melting the solder bump and the solder layer while the solder layer and the solder bump are in contact, thereby forming a doped solder bump consisting essentially of Sn, one or both of Ag and Cu, and the fourth row transition metal dopant.

20 Claims, 6 Drawing Sheets

(52) U.S. Cl.
CPC ............ *H01L 2924/01006* (2013.01); *H01L 2924/01012* (2013.01); *H01L 2924/01019* (2013.01); *H01L 2924/01021* (2013.01); *H01L 2924/01022* (2013.01); *H01L 2924/01023* (2013.01); *H01L 2924/01024* (2013.01); *H01L 2924/01025* (2013.01); *H01L 2924/01027* (2013.01); *H01L 2924/01029* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01)

(56) References Cited

U.S. PATENT DOCUMENTS

| | | | |
|---|---|---|---|
| 6,875,291 | B2 | 4/2005 | Kanematsu et al. |
| 6,936,219 | B2 | 8/2005 | Kopeliovich et al. |
| 7,013,564 | B2 | 3/2006 | Shimokawa et al. |
| 2004/0188503 | A1* | 9/2004 | Hua .............................. 228/254 |
| 2005/0100474 | A1 | 5/2005 | Huang et al. |
| 2005/0110163 | A1* | 5/2005 | Koo et al. .................... 257/778 |
| 2006/0113683 | A1* | 6/2006 | Dean et al. ................... 257/783 |
| 2007/0295528 | A1 | 12/2007 | Nishi et al. |

FOREIGN PATENT DOCUMENTS

| | | |
|---|---|---|
| JP | 2002016211 A | 1/2002 |
| JP | 2004233243 A | 8/2004 |
| JP | 2004240753 A | 8/2004 |
| JP | 2005103645 A | 4/2005 |
| TW | 444258 B | 7/2001 |
| TW | 200511546 A | 3/2005 |
| WO | 03/004713 A2 | 1/2003 |

OTHER PUBLICATIONS

Kang, S., et al., "Critcal Factors Affecting the Undercooling of Pb-free, Flip-Chip Solder Bumps and In-situ Observation of Soldification Process," IEEE Electronic Components and Technology Conference, 2007, pp. 1597-1603.

Kang, S., et al., "Nickel-Alloyed Tin—Lead Eutectic Solder for Surface Mount Technology," Materials Research Society, May 1993, pp. 1033-1040, Abstract.

Kang, S., et al., "Microstruture and Mechanical Properties of Lead-Free Solders and Solder Joints Used in Microelectronic Applications," IBM Journal Research and Devolpment, vol. 49, No. 4/5, Jul./Sep. 2005, p. 607-620.

Kim, K.S., et al., "Effects of Fourth Alloying Additive on Microstructures and Tensile Properties of Sn—Ag—Cu Alloy and Joints with Cu," Microelectronics Reliability, vol. 43, 2003, pp. 259-267.

"Soft Solder" Integrated Publishing, http://www.tpub.com/steelworker1/57.htm, Jul. 23, 2008, 3 pages.

Sonoda, T., et al., "Advanced Lithium Secondary Batteries Using Tin—Iron Alloy Negative Electrodes Prepared by Electroplating," Denki Kagaku Oyobui Kogyo Butsuri Kagaku, vol. 71, No. 12, pp. 1096-1098.

Sousa, I., et al., "The Influence of Low Level Doping on the Thermal Evolution of SAC Alloy Solder Joints with Cu Pad Structures," IEEE Electronic Components and Technology Conference, 2006, pp. 1454-1461.

Zaki, N., "Zinc Alloy Plating," PF Online, http://www.pfonline.com/articles/article_print1.cfm, Gardner Publications, 2008, 5 pages.

* cited by examiner

PB-FREE SOLDER BUMPS WITH IMPROVED MECHANICAL PROPERTIES

CROSS-REFERENCE TO RELATED APPLICATIONS

This application is the National Stage of, and therefore claims the benefit of, International Application No. PCT/US2008/076543 filed on Sep. 16, 2008 entitled "PB-FREE SOLDER BUMPS WITH IMPROVED MECHANICAL PROPERTIES," which was published in English under International Publication Number WO 2010/033107 on Mar. 25, 2010. The above application is commonly assigned with this National Stage application and is incorporated herein by reference in its entirety. The application is also a divisional application of U.S. patent application Ser. No. 13/063,181, filed on Mar. 9, 2011, entitled, "PB-FREE SOLDER BUMPS WITH IMPROVED MECHANICAL PROPERTIES," which is incorporated herein by reference in its entirety.

TECHNICAL FIELD OF THE INVENTION

This disclosure relates generally to semiconductor manufacturing, and, more particularly, to solder bumps with improved mechanical properties.

BACKGROUND OF THE INVENTION

Solder bumps are used to join and electrically connect some semiconductor devices to a device package substrate. Typically a semiconductor device is formed with electrical contacts that correspond to electrical contacts on the package substrate. The solder bumps electrically and mechanically connect contacts of the semiconductor device to contacts of the substrate. The substrate includes conductive paths to route signals and power from the electrical contacts to package leads which may be connected to, e.g., a circuit board.

SUMMARY OF THE INVENTION

One embodiment is a method of forming an electronic device, comprising providing a semiconductor substrate having a first contact and an undoped electroplated lead-free solder bump formed on the first contact. The method also comprises providing a device package substrate having a second contact and a doped lead-free solder layer on the second contact comprising a fourth row transition metal dopant. The method further comprises melting the solder bump and the solder layer while the solder layer and the solder bump are in contact, thereby forming a doped solder bump consisting essentially of Sn, one or both of Ag and Cu, and the fourth row transition metal dopant.

Another embodiment is another method of forming an electronic device, comprising providing a semiconductor substrate having a first metal pad formed thereover. The method also comprises providing a device package substrate having a second metal pad formed thereover. The method further comprises providing a doped solder bump located between and in contact with the first and second metal pads, the doped solder bump consisting of Sn, one or both of Ag and Cu, and a fourth row transition metal dopant The doped solder bump has the concentration of the dopant in a range of 0.1 wt % to 2 wt %, with a deviation of 20% or less of an average of the concentration throughout the doped solder bump.

Another embodiment is another method of forming an electronic device, comprising providing a semiconductor substrate having a first metal pad formed thereover. The method also comprises providing a device package substrate having a second metal pad formed thereover. The method further comprises providing a doped solder bump located between and in contact with the first and second metal pads, the doped solder bump consisting of Sn, one or both of Ag and Cu, and a fourth row transition metal dopant, wherein a concentration of the dopant in the doped solder bump exceeds a solubility limit of the dopant in Sn at the melting point of Sn.

Another embodiment is another method of forming an electronic device, comprising providing a semiconductor substrate having a first metal pad formed thereover. The method also comprises providing a device package substrate having a second metal pad formed thereover. The method further comprises providing a doped solder bump located between and in contact with the first and second metal pads, the doped solder bump consisting of Sn at a first concentration, one or both of Ag and Cu at a second concentration, and a dopant at a third concentration, wherein the doped solder bump has a first undercooling temperature that is less than a second undercooling temperature of an undoped solder bump consisting of a same the first concentration of Sn and a same the second concentration of the one or both of Ag and Cu.

The foregoing has outlined features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

The embodiments herein describe a solder bump that includes a dopant to improve the mechanical properties thereof. It is believed that the dopant promotes the formation of a larger number of crystal grains in the doped bump than in a comparable undoped bump. The more numerous grains in the doped bump are thought to confer more isotropic mechanical properties to the doped bump than has the undoped bump, reducing the rate of mechanical failure of bumps in a packaged semiconductor device that may lead to electrical failure.

Various theoretical considerations in the following discussion are presented without limitation to provide background to illuminate the disclosure. The discussion of theory is limited to those considerations relevant to the present discussion. Certain factors may be omitted for clarity or simplification of the present discussion without limitation.

Lead (Pb)-tin (Sn) solders have been used in the past, and have provided a combination of electrical and mechanical properties that are compatible with operation over a wide temperature range. One aspect of this compatibility is the formation of a large number of randomly oriented crystal grains with poorly correlated crystallographic orientations. The poor correlation results in isotropic mechanical properties and ductile behavior over a wide temperature range. These properties accommodate thermal stresses between components of an electronic assembly without transferring excessive stresses to the components.

However, environmental concerns over the adverse ecological effects of Pb have resulted in legislation in various parts of the world that explicitly restricts the use of Pb in electronics. For example, the Restriction of Hazardous Substances (RoHS) directive, adopted by the European Union in 2003 and effective beginning in 2006, restricts the concentration of lead in any homogeneous component to 0.1 wt. % (1000 ppm) or less. A solder having 0.1 wt. % or less of lead is referred to herein as lead-(or Pb-) free. The permitted concentration of Pb is, in general, too low to confer the desired crystalline structure to Sn-based solder.

The crystalline structure of a solder is determined in part by the solidification undercooling temperature (herein referred to as "undercooling" for brevity) of the solder. As used herein, undercooling is the temperature difference between a nominal melting point of an elemental or alloyed metal and a temperature below the melting point to which the metal must be lowered to cause the metal to solidify. In general, as described further below, a smaller undercooling is associated with crystalline properties favorable to desired mechanical properties of the solder. Factors that influence the undercooling include, e.g., impurities and the size of the solder sample.

As used herein, a solder is a metallic composition that includes at least about 95 wt. % Sn and may include an alloying metal such as, e.g., copper or silver. This definition disregards the presence of one or more dopants, as discussed further below. Example solders include, e.g., pure Sn, Sn—Ag, Sn—Cu and Sn—Ag—Cu (SAC). A doped solder includes a solder, e.g., one of the aforementioned compositions, and a dopant. As described further below, in various embodiments, the dopant may be selected from one of the fourth row transition metals (as determined by the standard Mendeleev periodic table of the elements), e.g., Sc, Ti, V, Cr, Mn, Fe, Co, Ni and Zn. Cu has been shown to be ineffective at reducing undercooling and is specifically excluded from the list of dopants. Of the aforementioned transition metals, some may be preferred. For example, Mn, Fe, Ni and Zn may be less prone to oxidation, and therefore, have greater utilization in certain devices. As described further below, the concentration of a dopant contemplated by embodiments herein is about 2 wt. % or less.

While certain dopants have been found to reduce the undercooling of Pb-free Sn-based solder compositions, methods of forming solder bumps with a concentration in the range disclosed in the embodiments herein remain elusive. As used herein, a solder bump is a quantity of a Pb-free Sn-based solder composition attached to an under bump metallization (UBM) pad, and having a maximum diameter of about 250 µm, a maximum volume of about 5E-4 $cm^3$, or a maximum mass of about 3 mg. As described further below, formation of the bump includes electroplating a doped solder composition onto the UBM pad. In some cases, the bump may be a member of a bump array.

Figure 1:
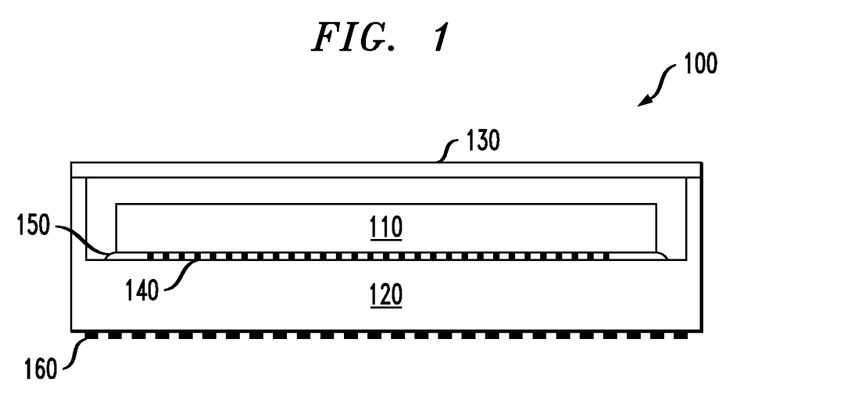
FIG. 1 illustrates an electronic device formed according to the disclosure.

Turning initially to FIG. 1, illustrated is an electronic device generally designated 100 formed according to the disclosure. The electronic device 100 includes a semiconductor substrate 110 electrically and mechanically connected to a device package substrate 120. The substrate 110 may be, e.g., an electronic device die. The device 100 is illustrated without limitation as including a conventional cover 130, e.g., to protect the substrate 110 from the ambient. In some embodiments, the substrate 110 is alternatively or additionally protected by an encapsulant. An electrical connection between the substrate 110 and the package substrate 120 is provided by a solder bump 140 that is connected to electrical contacts (shown in FIG. 2, e.g.) formed on the semiconductor substrate 110 and the substrate 120. A conventional underfill 150 is formed between the substrate 110 and the substrate 120. The substrate 120 includes conductive paths (not shown) configured to electrically connect the contacts formed thereon to package contacts 160, illustrated without limitation as a ball grid array (BGA).

Figure 2:
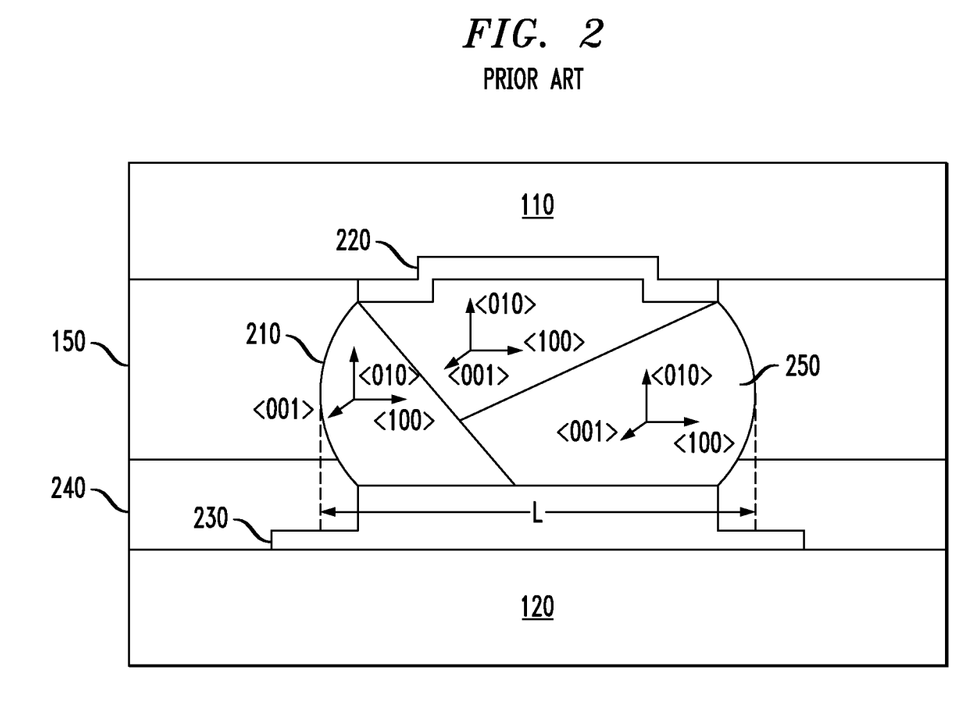
FIG. 2 illustrates a prior art solder bump with a small number of crystal grains having highly correlated crystallographic orientations.

FIG. 2 illustrates a detailed sectional view of a prior art solder bump 210 and structural elements of the package 100 in the immediate vicinity of the prior art solder bump 210. The semiconductor substrate 110 includes a UBM pad 220. The UBM pad 220 may be electrically connected to circuits of the semiconductor substrate 110, or provide power and ground connection thereto, e.g. The substrate 120 includes a conventional post 230 that may be formed, e.g. of copper. The UBM pad 220 or the post 230 may optionally include a barrier metal layer, e.g., nickel. A solder mask 240 includes openings through which the prior art solder bump 210 may make electrical contact with the post 230.

The prior art solder bump 210 is formed from a conventional (undoped) solder formulation, e.g., Sn—Ag or Sn—Cu. The diameter of the prior art solder bump 210 is consistent with high density bump arrays, e.g., about 250 µm or smaller. At this scale, the thermodynamics of crystallization of the prior art solder bump 210 favor the formation of a relatively small number of grains 250. The grains 250 may have a highly correlated crystallographic orientation. Restated, the grains 250 may be generally aligned such that lattice axes associated with the grains 250 have a similar orientation. Such orientation may have a detrimental effect on the reliability of the prior art solder bump 210 and/or the semiconductor substrate 110. In particular, such aligned grains may lead to a fracture failure of the prior art solder bump 210.

Tin has a body-centered tetragonal unit cell. The tetragonal unit cell results in significant anisotropy of the elastic and thermal expansion characteristics thereof. It is thought that this anisotropy results in accumulation of damage in oriented solder bumps with thermal cycling, which may result in fracture of the bump and associated failure of packaged electronic device of which the bump is a part. Moreover, some orientations may result in enhanced shear strain when the Sn grains are oriented such that the <001> crystallographic direction is about parallel to the substrate pad. In contrast, when a grain is oriented with the <100> or <010> direction parallel to the substrate pad, then shear strain is thought to be minimized. Furthermore, this anisotropy can lead to a shear stress that exceeds a critical stress of dielectric layers in the substrate 110, resulting in adhesive or cohesive failure and delamination of the dielectric. The risk of delamination is thought to be particularly significant when the <001> direction is about parallel to the solder pad and the dielectric layers, but not when the <100> or <010> directions are similarly orientated. This risk is especially pronounced when the substrate 110 employs certain "low-k" dielectric layers such as organic or porous dielectrics.

It is thought that the aforementioned deficiencies of highly-correlated tin-based solder bumps having highly correlated grains may be mitigated by reducing the size of the crystal grains in the solder bump, and reducing the correlation of grain orientation. One method of achieving these improved characteristics is reducing the undercooling temperature of the solder bump.

The amount of undercooling needed to initiate solidification of tin generally increases as the size of a molten tin sample decreases, due to, e.g., surface energy effects and available nucleation sites. In undoped tin, e.g., grains are believed to nucleate at a location at which random thermal motion causes a large enough number of tin atoms to fall into the correct position of the solid tin lattice to form an embryo. As the size of the molten tin sample decreases, a fewer number of embryos are expected to be present in the melt. Depending on the alloy and the sample size, necessary undercooling may be 50 C. or greater. Thus, the driving energy for solidification may become quite large. When nucleation of a grain does occur, the driving force may cause the grain to rapidly grow. Moreover, the heat of fusion released by the solidifying tin grain at the advancing solidification front may melt neighboring nucleating grains. Thus, this combination of factors is thought to favor the formation of only a few grains in a small sample, and for the orientation of some grains to be highly correlated.

Figure 3:
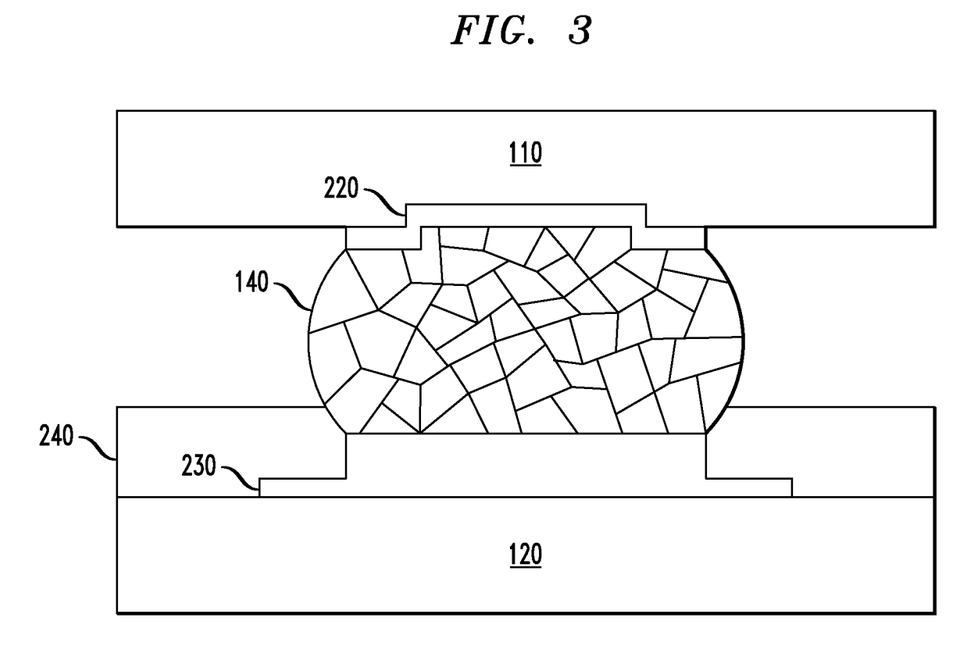
FIG. 3 illustrates a solder bump formed according to the disclosure with a large number of crystal grains having poorly correlated crystallographic orientations.

FIG. 3 illustrates the solder bump 140 formed according to the disclosure. The solder bump 140 includes numerous small grains the crystal orientation of which is poorly correlated. It is thought that reducing the undercooling of the tin melt increases the number of grains in the tin melt, and reduces the size thereof relative to the undoped tin. In some cases, the solder ball 140 may have 10 or more grains. When nucleation and growth of grains occurs with lower undercooling, the energy released by the growing grain is smaller, and the advancing solid/liquid interface progresses slower. There is more time for other embryos to nucleate grains, and growing grains are less likely to consume each other by remelting. In this manner, improved mechanical properties of the bump are obtained.

A beneficial concentration of a dopant is sufficient to reduce undercooling, but low enough that any difference in melting point of the doped and undoped solder is insignificant, e.g., less than about 5 C. In general, this concentration is less that about 2 wt. % of the dopant. In some cases, a concentration of less than 1 wt. % is preferred, e.g., to ensure process margin with respect to possible negative effects of a concentration greater than 2 wt. %

A dopant has a solubility limit in Sn at the melting point of tin, about 232 C. Herein, a solder bump with a concentration of the dopant at the solubility limit is referred to as saturated. A dopant concentration below this limit is referred to herein as unsaturated, and a dopant concentration greater than this limit is referred to as supersaturated. In some cases, it is desirable to have a supersaturated concentration of the dopant in the solder bump. Without limitation by theory, it is thought that such a concentration leads to the formation of a greater number of nucleation sites within the solder bump than is possible with a saturated or unsaturated solder bump, leading to a greater number of grains and poorer correlation of crystal orientations of the grains. This effect is particularly beneficial in solder bumps having a diameter of about 250 µm or less, or having a volume of about 5E-4 $cm^3$ or less, or having a mass of about 3 mg or less.

A supersaturated dopant concentration is contrary to known solder bumps having the recited size characteristics. For example, a solder bump may dissolve a portion of a UBM pad, thereby introducing an element in the pad into the solder bump. But the concentration of such element is solubility-limited. Ni for example has a solubility limit of about 0.2 wt. % or less in Sn at 232 C. This concentration is thought to generally be insufficient to confer adequate benefit to the mechanical properties of the solder bump.

Current state-of-the-art solder bump formation typically uses electroplating to deposit a solder composition onto UBM pads of a device substrate. It is technically difficult, and in many cases not currently feasible, to electroplate a doped Sn-based solder in a controllable composition with the desired dopant concentration, e.g. below about 2 wt. %, due to differences in element electronegativity. For example, the electronegativity of Sn is about 1.96 (Pauling units), while that of Zn is about 1.65. In many electroplating processes, the process will tend to preferentially deposit Sn due to the higher electronegativity. This process bias is sensitive to process variations such as concentration, plating current and plating bath mixing, e.g., making control of the relative concentrations of Sn and Zn in the plated layer difficult. This difficulty is magnified when doping a binary or ternary alloy, such as Sn—Ag, Sn—Cu or SAC.

This disclosure reflects the recognition that the deficiencies of the prior art electroplated solder bump and methods of forming solder bumps may be overcome by indirectly doping the solder bump 140 at a desired concentration. The dopant may be provided in a solder layer formed over the substrate 120 before joining the substrate 110 and the substrate 120. The solder bump 140 may thereby be doped at a lower concentration with greater control than is practical or feasible directly doping the solder bump during electroplating.

Figure 4:
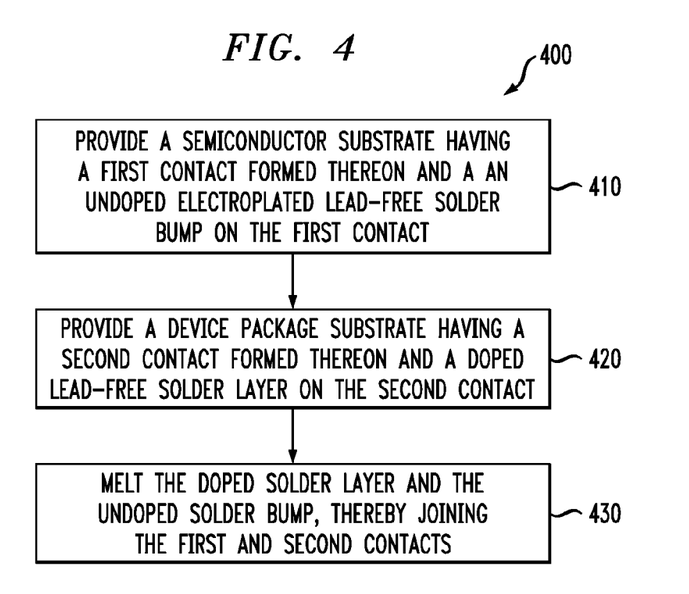
FIG. 4 illustrates a method according to the disclosure.
Figure 5:
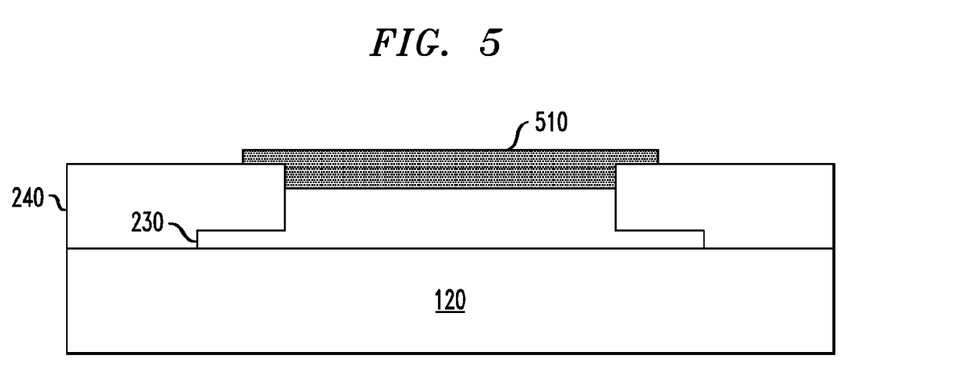
FIG. 5 illustrates a metal contact of a package substrate with a solder layer formed thereon.
Figure 6:
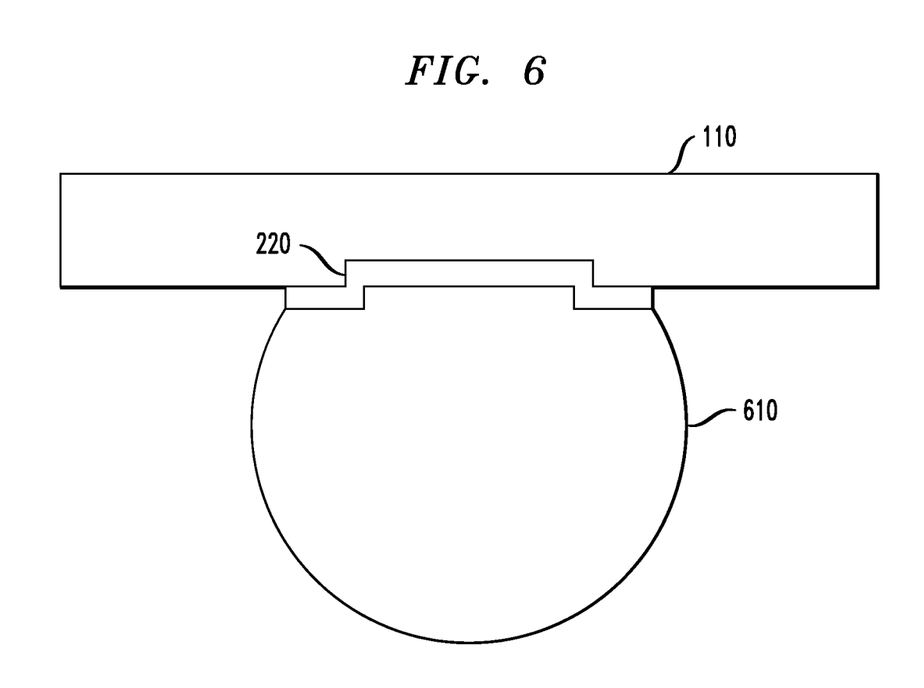
FIG. 6 illustrates a contact of an electronic device with an undoped solder bump formed thereon.
Figure 7A:
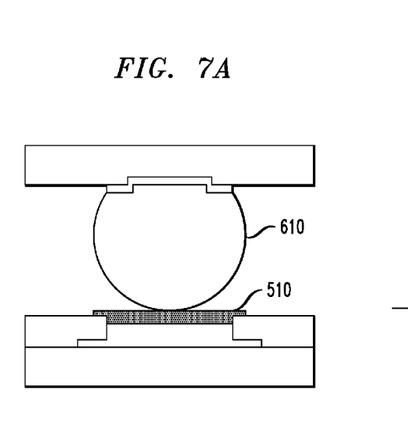
FIGS. 7A and 7B illustrate joining an electronic device and a package substrate to produce the doped solder bump of the disclosure.
Figure 7B:
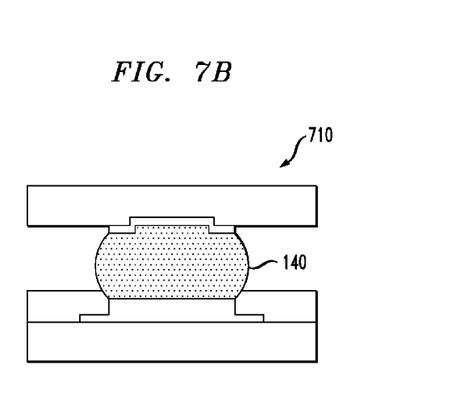

Turning to FIG. 4, illustrated are steps in a method generally designated 400 of doping solder bumps. FIG. 4 is described with concurrent reference to FIGS. 5, 6 and 7A/7B which illustrate various steps of the method. FIG. 5 illustrates a sectional view of the substrate 120 with a solder layer 510 formed thereover. FIG. 6 illustrates a sectional view of the substrate 110 with an undoped solder bump 610 formed on the UBM pad 220. FIGS. 7A and 7B illustrate a sectional view of the solder layer 510 and the undoped solder bump 610 during joining by the process 400.

Initially, in a step 410, a substrate such as, e.g., the substrate 120, is provided with a contact 230 formed thereon and a solder layer 510 formed on the contact 230, as illustrated in FIG. 5. The solder layer 510 is illustrated as a heavily shaded region to reflect a concentration of the dopant therein that is greater than the concentration in the solder bump 140 after joining the substrate 110 and the substrate 120. This aspect is discussed in greater detail below.

Herein, provided includes obtaining a substrate from a source outside a local manufacturing environment in which further steps in the method 400 are performed. Provided also includes forming a solder layer on a substrate within the local manufacturing environment. When obtained from outside the local manufacturing environment, the substrate with the solder layer 510 formed thereon may be obtained from a third party, or from a business unit of the entity performing the following steps.

The beneficial concentration of the dopant in the solder bump 140 in some embodiments ranges from about 0.35 wt. % and about 2.0 wt. %. It is thought that when the concentration is too low, the dopant will not provide the desired reduction of undercooling, and/or the deposition process will be difficult or not technically feasible to provide with a desired control tolerance. In some cases, for instance, it is advantageous to provide a dopant concentration high enough to insure that the entire solder bump is doped to at least 0.1 wt. %. If it is not, then there may be a localized region of the joint that has a large undercooling. In this case, the benefits of adding the dopant may be substantially reduced or lost. Because the dopant distribution may be nonuniform, a concentration of 0.35 wt. % or greater may be desirable to ensure that the concentration is at least about 0.1 wt. % throughout the solder bump. Another consideration is process uniformity. In some embodiments, it is desirable to limit a deviation of the dopant concentration across or between substrates to about 20% or less of an average concentration thereof. In these cases, a lower beneficial concentration of 0.25 wt. % is thought to meet this objective in many cases.

At too high a concentration, the dopant may form precipitates large enough to undesirably affect the mechanical properties of the solder bump, such as ductility, or may affect thermal properties such as melting point, or chemical properties such as oxidative stability. This upper limit will in general be different for different dopants, but is expected to be up to about 2.0 wt. % for the dopants within the scope of this disclosure. In some cases, the limit will be lower, either because there is a maximum concentration above which no further benefit is conferred by the dopant, or because undesirable effects such as those aforementioned become significant above the maximum beneficial concentration. This lower maximum dopant concentration is thought to be about 0.5 wt. %.

The solder layer 510 is overdoped with the dopant of interest. Overdoped means that the solder layer includes one of the aforementioned dopants at a concentration greater than that of the solder bump 140 formed by the process 400. The solder layer 510 may be, e.g., finely divided particles or solidified from a melt. In some embodiments the solder layer provides the dopant at a concentration greater than the solubility limit of the dopant in the solder layer 510 at the solder melting point, e.g., a supersaturated solution. When the solder layer 510 comprises finely divided particles, it may be formed by, e.g., a solder paste. A solder paste may be applied using conventional methods, such as, e.g. silkscreening. The high surface area of the particles provides free energy that aids formation of a supersaturated solution.

The concentration of the dopant in the solder layer 510 may be scaled to provide a predetermined concentration in the solder bump. For example, the solder layer 510 typically will provide a fixed predetermined portion of the total volume of the solder bump 140. In one illustrative embodiment, e.g., the solder layer is configured to provide about 25% of the total volume of the solder bump 140, and the undoped solder bump 610 is configured to provide about 75% of the total volume. In this case, the solder layer 510 may contain about four times the desired predetermined concentration of dopant in the solder bump 140. For example, if the dopant concentration in the solder bump 140 may range from about 0.35 wt. % to about 2 wt. %, then the dopant concentration in the solder layer 510 may range from about 1.4 wt. % to about 8 wt. %. Where the solder layer 510 provides a different proportion of the solder bump 140 volume, the concentration of the dopant in the solder layer may be scaled as necessary to result in the desired dopant concentration in the solder bump 140.

The solder layer 510 may have a same or different concentration of non-dopant elements as the undoped solder bump 610. For example, the solder layer 510 may include Cu or Ag in about the same concentration as present in the undoped solder bump 610. In other cases, the solder layer 510 is a different solder composition. For example, the solder layer 610 may consist essentially of only Sn, and the solder layer 510 may include Cu and/or Ag in addition to the dopant to result in a desired solder allow, such as SAC, e.g.

Returning to FIG. 4, with continuing reference to FIG. 6, in a step 420 the electronic device substrate 110 is provided with the undoped solder bump 610 formed on the UBM pad 220. The undoped solder bump 610 is formed by electroplating, and may be any lead-free alloy of Sn, such as, e.g., Sn—Cu, Sn—Ag or SAC. The undoped solder bump 610 is illustrated after an optional reflow process in which the undoped solder bump 610 assumes a spheroidal shape. In other cases, the reflow process may be omitted, in which case, the undoped solder bump 610 will generally not be spheroidal.

With reference to FIGS. 4, 7A and 7B, in a step 430 the undoped solder bump 610 and the solder layer 510 are brought into physical contact as illustrated in FIG. 7A. The temperature of the undoped solder bump 610 and the solder layer 510 are raised to a temperature sufficient to melt both, e.g., about 232 C. In the liquid phase, the elements provided by both the undoped solder bump 610 and the solder layer 510 rapidly interdiffuse to produce an assembly 710 having a molten solder bump 140 with the desired dopant concentration. The temperature of the assembly 710 is then lowered below the melting point. In some embodiments, the molten solder bump 140 is held above the melting temperature for fewer than about 10 s to reduce the number or size of solid precipitates that may deplete the melt of the dopant. As the solder bump 140 cools, the presence of the dopant promotes nucleation of numerous grains having the aforementioned characteristics, e.g., more isotropic mechanical properties. Additional conventional packaging steps such as, e.g., providing the underfill 150 and cover 130 may be performed to complete the electronic device 100.

In some embodiments the solder layer 510 provides the dopant at a concentration that ensures that the dopant will be present in the solder bump 140 at a concentration greater than the solubility limit of the dopant in solder bump 140 at the solder melting point, e.g., supersaturated with the dopant. It is believed that when the solder bump 140 is supersaturated the dopant may form a large number of nanoprecipitates as the molten solder cools. These precipitates then may act as nucleation sites for tin grains, as described previously, leading to the observed reduced undercooling relative to the undoped tin. In some cases, dopant particles may not completely dissolve in the molten solder, and may act as nucleation sites with or without further precipitation of the dopant. In some embodiments, the solder paste may be partially or fully reflowed prior to joining the substrate 110 and the substrate 120.

In the method described above, the undoped solder ball 610 and the doped solder layer 510 cooperate to form the solder bump 140. Because the solder layer 510 is formed from a mechanical mixture, the composition therein is not limited by effects such as those that limit the composition of an electroplated layer. Thus, the method provides greater freedom of dopant selection and concentration range than conventional methods of solder bump formation. Moreover, control of the dopant concentration in the solder bump is improved over conventional processes. Solder bumps formed by the described method are expected to have mechanical properties superior to those of conventional solder bumps, and have greater uniformity of properties.

Although the present invention has been described in detail, those skilled in the art should understand that they can make various changes, substitutions and alterations herein without departing from the spirit and scope of the invention in its broadest form.

What is claimed is:

1. A method of forming an electronic device, comprising:
providing a semiconductor substrate having a first contact and an undoped electroplated lead-free solder bump formed on said first contact;
providing a device package substrate having a second contact and a doped lead-free solder layer on said second contact comprising a fourth row transition metal dopant, wherein the fourth row transition metal dopant includes at least one of Sc, Ti, V, Cr, Mn, Fe, Co, Ni or Zn; and
melting said solder bump and said solder layer while said solder layer and said solder bump are in contact, thereby forming a doped solder bump consisting essentially of Sn, one or both of Ag and Cu, and said fourth row transition metal dopant.

2. The method as recited in claim 1, wherein a concentration of said dopant in said dopant in said doped solder bump exceeds a solubility limit of said dopant in Sn at the melting point of Sn.

3. The method as recited in claim 1, wherein said doped solder bump comprises at least 10 crystal grains.

4. The method as recited in claim 1, wherein said doped solder bump comprises between about 0.35 wt. % and about 2 wt. % of said dopant.

5. The method as recited in claim 1, wherein said doped solder bump comprises between about 0.35 wt. % and about 0.5 wt. % of said dopant.

6. The method as recited in claim 1, wherein said dopant comprises Zn.

7. The method as recited in claim 1, wherein said dopant comprises Ni.

8. The method as recited in claim 1, wherein said dopant comprises Fe.

9. The method as recited in claim 1, wherein said dopant comprises Mn.

10. The method as recited in claim 1, wherein said solder layer is a solder paste.

11. The method as recited in claim 1, wherein said doped solder bump has a volume of about 5E-4 cm$^3$ or less.

12. The method as recited in claim 1, wherein said solder layer has a concentration of said dopant about four times greater than a concentration of said dopant in said solder bump.

13. The method as recited in claim 1, wherein said dopant comprises Sc.

14. The method as recited in claim 1, wherein said dopant comprises Ti.

15. A method of forming a semiconductor device, comprising:
providing a semiconductor substrate having a first metal pad formed thereover;
providing a device package substrate having a second metal pad formed thereover; and
providing a doped solder bump located between and in contact with said first and second metal pads, said doped solder bump consisting of Sn, one or both of Ag and Cu, and a fourth row transition metal dopant, wherein the fourth row transition metal dopant includes at least one of Sc, Ti, V, Cr, Mn, Fe, Co, Ni or Zn, and wherein said doped solder bump has a concentration of said dopant in a range of 0.1 wt % to 2 wt %, with a deviation of 20% or less of an average of said concentration throughout said doped solder bump.

16. A method of forming an electronic device, comprising:
providing a semiconductor substrate having a first metal pad formed thereover;
providing a device package substrate having a second metal pad formed thereover; and
providing a doped solder bump located between and in contact with said first and second metal pads, said doped solder bump consisting of Sn, one or both of Ag and Cu, and a fourth row transition metal dopant, wherein a concentration of said dopant in said doped solder bump exceeds a solubility limit of said dopant in Sn at the melting point of Sn.

17. A method of forming an electronic device, comprising:
providing a semiconductor substrate having a first metal pad formed thereover;
providing a device package substrate having a second metal pad formed thereover; and
providing a doped solder bump located between and in contact with said first and second metal pads, said doped solder bump consisting of Sn at a first concentration, one or both of Ag and Cu at a second concentration, and a dopant at a third concentration, wherein said doped solder bump has a first undercooling temperature that is less than a second undercooling temperature of an undoped solder bump consisting of a same said first concentration of Sn and a same said second concentration of said one or both of Ag and Cu.

18. The method recited in claim 17, wherein said doped solder bump has a melting point that is within about 5° C. of a melting point of said undoped solder bump.

19. The method recited in claim 15, wherein said fourth row transition metal dopant includes at least one of Mn, Fe, Ni, or Zn.

20. The method recited in claim 15, wherein a concentration of said dopant in said doped solder bump is a supersaturated concentration of said dopant.

* * * * *